United States Patent [19]
Yanagida et al.

[11] Patent Number: 5,180,094
[45] Date of Patent: Jan. 19, 1993

[54] WIRE BONDER WITH BONDING ARM ANGLE SENSOR

[75] Inventors: Katsuro Yanagida; Yoshikatsu Hayashizaki, both of Tokyo, Japan

[73] Assignee: Kaijo Corporation, Tokyo, Japan

[21] Appl. No.: 841,332

[22] Filed: Feb. 25, 1992

[30] Foreign Application Priority Data

Feb. 27, 1991 [JP] Japan .................... 3-053516

[51] Int. Cl.⁵ .................... B23K 20/10; H05K 13/06
[52] U.S. Cl. .................................... 228/4.5; 228/8
[58] Field of Search ............ 228/1.1, 4.5, 8, 110, 228/179, 102, 103

[56] References Cited

U.S. PATENT DOCUMENTS

| | | |
|---|---|---|
| 4,653,681 | 3/1987 | Dreibelbis et al. ............ 228/4.5 |
| 5,080,276 | 1/1992 | Kashima et al. ............ 228/4.5 |

FOREIGN PATENT DOCUMENTS

| | | |
|---|---|---|
| 124240 | 9/1980 | Japan .................... 228/4.5 |
| 59-11636 | 1/1984 | Japan . |
| 67927 | 4/1986 | Japan .................... 228/4.5 |
| 67928 | 4/1986 | Japan .................... 228/4.5 |
| 159744 | 7/1986 | Japan .................... 228/4.5 |
| 163648 | 7/1986 | Japan .................... 228/4.5 |
| 214441 | 9/1986 | Japan .................... 228/4.5 |
| 143541 | 6/1990 | Japan .................... 228/4.5 |
| 2-30838 | 8/1990 | Japan . |

*Primary Examiner*—Samuel M. Heinrich
*Attorney, Agent, or Firm*—Sughrue Mion Sinn Macpeak & Seas

[57] ABSTRACT

A wire bonder processes an angle sensor which detects, without making contact, the angle of rotation of a bonding arm provided so as to be allowed to freely oscillate centered on a shaft supported by a head base, and is able to easily determine the amount of movement of a bonding tool and a distance to a bonding stage.

10 Claims, 3 Drawing Sheets

WIRE BONDER WITH BONDING ARM ANGLE SENSOR

BACKGROUND OF THE INVENTION

1. Field of the Invention

The present invention relates to a wire bonder which performs assembly of semiconductor integrated circuits (IC), etc., and more particularly, relates to a wire bonder which is able to easily detect the amount of movement of the end of a bonding tool of a bonding head thereof as well as the position of said bonding tool.

2. Description of the Prior Art

With respect to the prior art, in the case of manufacturing semiconductor integrated circuits (IC) or large-scale integrated circuits (LSI), by displacing a bonding tool holding a wire with respect to a lead frame and semiconductor pellet after positioning said lead frame on which said semiconductor pellet is arranged on a conveyor device, bonding is performed by respectively guiding the wire to a lead arranged on said lead frame and to a pad on said semiconductor pellet. Wire bonding by this type of process is performed using bonding head 1 possessing an oscillation mechanism which allows oscillation of bonding tool 2 in the vertical direction as indicated in FIGS. 1(A) and 1(B).

The following provides a description of the composition of said bonding head 1.

In FIG. 1(A) and 1(B), bonding arm 3 is mounted on shaft 5 supported by head base 4 so as to be allowed to oscillate. Horn 3a is mounted on bonding arm 3 and is formed into an approximately conical shape which tapers towards the free end. Bonding tool 2 (also referred to as a capillary) is mounted on the end of said horn 3a. A hole is formed in the center of said bonding tool 2 which allows the insertion of wire 11 made of aluminum, gold or other wire material. The device is composed so as to allow said wire 11, which is clamped by a clamper or similar device (not shown) at the top of horn 3a, to be fed out a fixed length at a time from the end of bonding tool 2 through said hole. The other end of said wire 11 is wound around a reel (not shown) so that a fixed amount of tension is applied to prevent slack from forming in said wire 11.

In addition, voice coil 6a of a linear motor 6 is provided on the other end of above-mentioned bonding arm 3. This coil 6a is inserted within a magnetic cap of magnetic circuit 6b, comprised of a permanent magnet and a yoke, so as to be allowed to oscillate vertically. This magnetic circuit 6b is fixed to head base 4. This head base 4 is fixed on an XY table (not shown) which can be driven in the X and Y directions. In addition, the end of shaft 5 which supports bonding arm 3 is coupled with shaft 8a of rotary encoder 8 mounted on head base 4 by means of coupling 7.

On the other hand, a semiconductor pellet (not shown), which is positioned and arranged on a bonding stage on which bonding work is performed, is placed beneath bonding tool 2. In addition, a detecting sensor (not shown) is provided on the side of bonding arm 3 which is comprised of an optical sensor or similar device that detects the reference position (origin) of bonding arm 3.

The following provides a description of the operation of the device having the composition described above.

When coil 6a of linear motor 6 mounted on bonding arm 3 is excited, bonding arm 3 rotates while oscillating in the counter-clockwise direction as viewed in FIG. 1(A) using shaft 5 as a pivot point as a result of the thrust of linear motor 6. Then, after the end of bonding tool 2 has been lowered at high speed to a specified position above a pad of a semiconductor pellet, the speed of bonding tool 2 is reduced to low speed. Bonding tool 2 then crushes a ball formed on the end of wire by means of a torch (an electric discharge device) (not shown) located on the end of said bonding tool 2, onto the upper surface of the pad on the semiconductor pellet, thus resulting in thermocompression bonding. Bonding is often aided at this time by applying ultrasonic vibration to the end of bonding tool 2.

The amount of movement of said bonding tool 2 is calculated by a control device not shown, such as a microcomputer or similar device, by counting a series of pulses output from rotary encoder 8 according to the angle of rotation traversed.

Conversely, following bonding, bonding arm 3 is rotated about shaft 5 in the clockwise direction as viewed in FIG. 1(A) by a previously set amount by exciting coil 6a of linear motor 6, after which it is stopped at that position. Bonding is then performed by moving bonding head 1 to the lead side, which is the next bonding point, according to the same process as described above, by moving the XY table.

The above-mentioned process is repeated until all pads of the semiconductor pellet and all leads of the lead frame are connected to complete bonding.

However, in the case of the wire bonder of the prior art, as the amount of movement of bonding arm 3 is determined by a control device by counting a series of pulses output from rotary encoder 8, this wire bonder has the disadvantage of not being able to determine the absolute amount of movement of bonding arm 3 based on the output of rotary encoder 8 alone. In other words, although the number of pulses can be counted to allow determination of the amount of movement corresponding to that number of pulses, the device is not able to confirm the location where the end of bonding tool 2 is positioned. Consequently, a separate detection sensor, which detects the origin position that serves as the reference for the end of bonding tool 2, is required. In addition, since the wire bonder of the prior art is dependent upon the efficiency of the resolution of the series of pulses that are output from rotary encoder 8, it also has the disadvantage of it being difficult to accommodate the entire amount of movement of bonding arm 3 from high speed to low speed with the resolution of rotary encoder 8. Moreover, as rotary shaft 8a of rotary encoder 8 is linked in a fixed fashion to shaft 5 by means of coupling 7, the wire bonder of the prior art also has the disadvantage of requiring considerable time for assembly and adjustment in order to align the shaft centers of the above-mentioned shafts since smooth oscillating method of bonding arm 3 cannot be obtained unless said shaft centers are aligned accurately.

SUMMARY OF THE INVENTION

Accordingly, the object to the present invention is to provide a wire bonder able to easily detect the amount of movement of the end of bonding tool of a bonding head as well as the position of said tool, thus overcoming the above-described problems of the prior art.

Accordingly, the present invention includes: a head base provided on a member capable of planar movement in at least the X and Y directions; a shaft supported by said head base; and a bonding arm provided so as to be allowed to oscillate freely centered about said shaft while supporting a bonding tool through which a wire is passed; wherein, an angle sensor is provided which detects, without making contact, the angle of rotation (evalation) of said bonding arm.

DESCRIPTION OF THE PREFERRED EMBODIMENTS

Figure 1A:
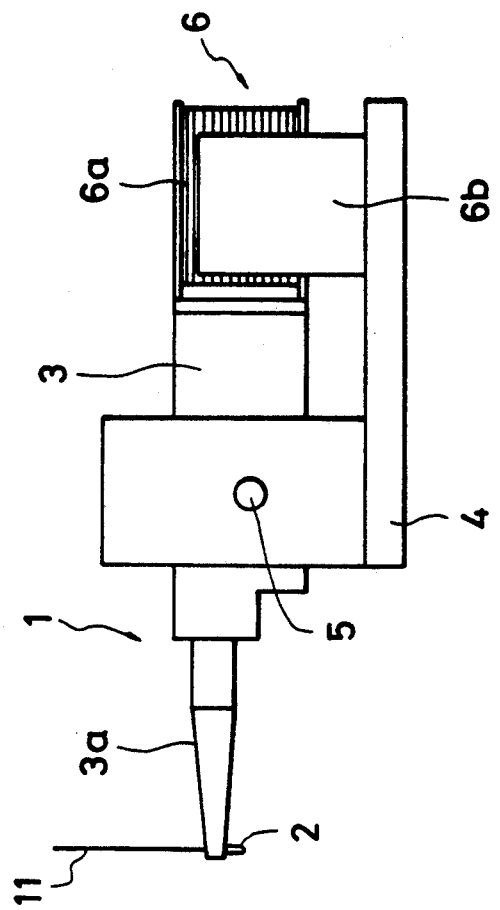
FIG. 1(A) is a front view which indicates the composition of the wire bonder of the prior art.
Figure 1B:
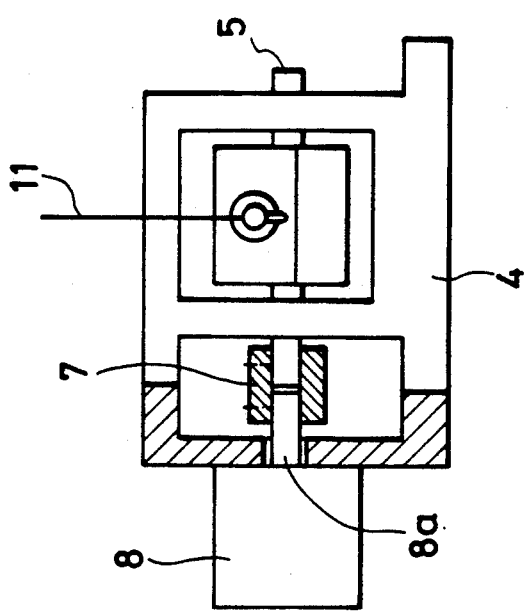
FIG. 1(B) is a side view of the wire bonder indicated in FIG. 1(A).

The following provides a description of the preferred embodiments of the wire bonder of the present invention. The wire bonder of the present invention differs from the device of the prior art indicated in FIGS. 1(A) and 1(B) by the use of an angle sensor. As other members have generally the same composition and functions, those members which are the same as the component members of the device of the prior art are described using the same symbols.

Figure 2A:
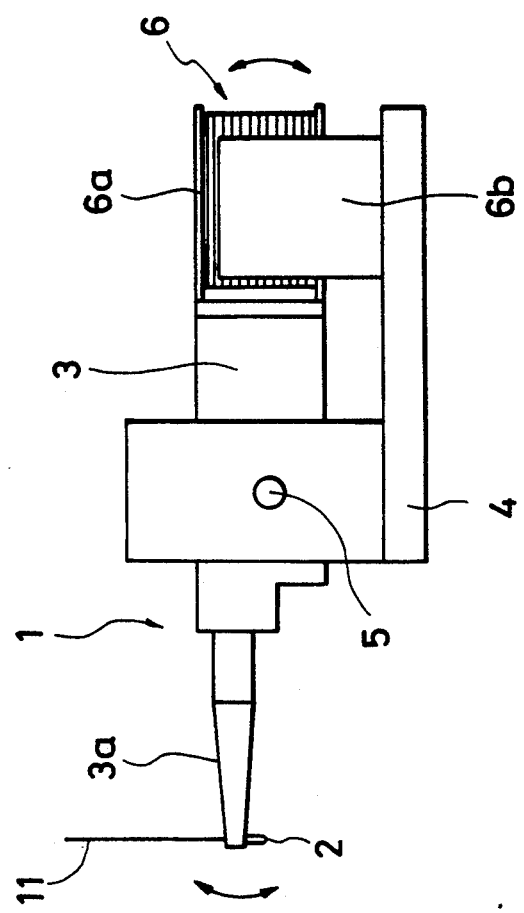
FIG. 2(A) is a front view which indicates the wire bonder of the present invention.
Figure 2B:
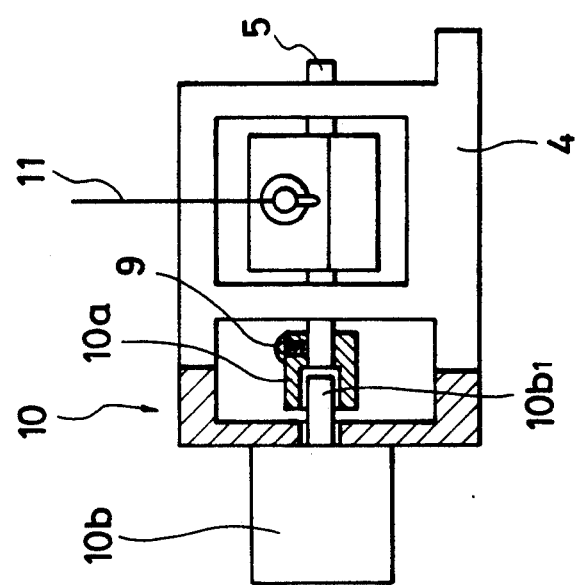
FIG. 2(B) is a side view of the wire bonder indicated in FIG. 2(A).

In FIGS. 2(A) and 2(B), bonding head 1 provided on head base 4 is installed on an XY table (not shown) capable of movement in the X and Y directions. Bonding is performed with wire 11 using bonding tool 2 between the lead of a lead frame and the pad (electrode) on a semiconductor pellet by moving and positioning bonding head 1 by means of said XY table. A semiconductor pellet, arranged on a bonding stage on which semiconductor work is performed, is placed beneath bonding tool 2 of bonding head 1. Bonding arm 3 is mounted to shaft 5 supported by head base 4 to allow oscillation. Horn 3a is mounted on said bonding arm and formed into an approximately conical shape which tapers towards the free end. Bonding tool 2 is mounted on the end of said horn 3a. A hole is formed in the center of said bonding tool 2 which allows the insertion of a wire 11 made of aluminum, gold or other wire material. The device is composed so as to allow said wire 11, which is clamped by a clamper or similar device (not shown) at the top of said horn 3a, to be fed out a fixed length at a time from the end of said bonding tool 2 through said hole. The other end of said wire 11 is wound around a reel (not shown) so that a fixed amount of tension is applied to prevent slack from forming in said wire 11.

In addition, voice coil 6a of a linear motor 6 is provided on the other end of above-mentioned bonding arm 3. This coil 6a is inserted within a magnetic cap of magnetic circuit 6b, comprised of a permanent magnet and a yoke, so as to be allowed to oscillate vertically. This magnetic circuit 6b is fixed to head base 4. This head base 4 is installed on an XY table (not shown) which can be driven in the X and Y directions.

In addition, angle sensor 10, provided on the end of shaft 5 which supports bonding arm 3, detects the amount of movement of the end of bonding tool 2 of bonding head 1 as well as the position of bonding tool 2, or in other words, the angle of rotation corresponding to the movement of bonding arm 3.

Said angle sensor 10 is composed of magnetic angle sensor magnetic body 10a and magnetic angle sensor detector 10b. Said magnetic angle sensor magnetic body 10a is in the shape of a cylinder having a cross-section in the shape of the letter "U", and is fastened to the end of shaft 5 using screw 9. On the other hand, magnetic angle sensor detector 10b is fastened to the side of the frame of head base 4. Sensor rod $10b_1$, responsible for the detection function, is inserted without making contact into the cylinder of said magnetic angle sensor magnetic body 10a.

Figure 3:
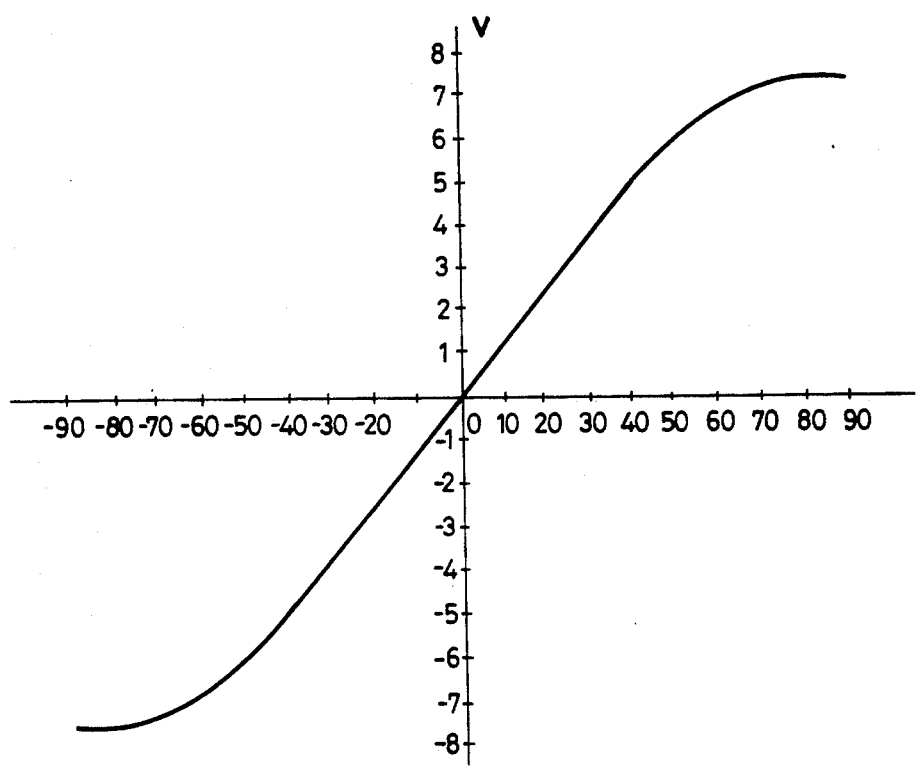
FIG. 3 indicates one example of the properties of the angle sensor provided on the wire bonder indicated in FIG. 2(B).

Magnetic angle sensor magnetic body 10a is rotated by the oscillating motion of bonding arm 3 pivoting on shaft 5. The device is composed so that an analog signal is output which is proportional to the angle of said magnetic body 10a with respect to magnetic angle sensor detector 10b. The relationship between the output voltage of said angle sensor 10 and the angle is indicated in FIG. 3. In addition, in this embodiment, an analog signal obtained in this manner is converted to a digital signal by an A/D converter (not shown) to achieve optimum resolution.

The following provides a description of the operation of the device of the present invention having the composition described above.

Firstly, when voice coil 6a of linear motor 6 mounted on bonding arm 3 is excited, bonding arm 3 rotates in the counter-clockwise direction as indicated in FIG. 2(A) using shaft 5 as a pivot point as a result of the thrust of linear motor 6. Then, after the end of bonding tool 2 lowers at high speed to a specified position above a pad of a semiconductor pellet, the speed of said bonding tool 2 is reduced to low speed. Bonding tool 2 then crushes a ball formed on the end of wire 11 by means of a torch (not shown) located on the end of said bonding tool 2, onto the upper surface of the pad on the semiconductor pellet, thus resulting in thermocompression bonding. Bonding is often performed at this time with the aid of ultrasonic vibrations applied to the end of bonding tool 2 through horn 3a. Furthermore, the majority of said horn 3a is formed in the shape of a cone, and its length in the axial direction is suitably set according to the ultrasonic waves which it is to propagate and amplify. The amount of movement and the position of said bonding tool 2 are calculated and determined by a control device, comprised of a microcomputer or similar device (not shown) to which analog signals output from angle sensor 10 according to the angle of rotation are input. In other words, based on the relationship between output voltage and angle as indicated in FIG. 3, the position of bonding tool 2 can be determined from said angle sensor 10. For example, if the output voltage of magnetic angle sensor detector 10b is 1 volt, it can be determined that the position of bonding tool 2 is 10 degrees. By offsetting the center axis of horn 3a of bonding arm 3 to 0 volts to serve as the reference position, in addition to it being possible to determine the amount of movement of bonding tool 2, it is also possible to determine the absolute height from the bonding stage of said bonding tool. Moreover, in the case an output of +1 volt is obtained at the reference position of magnetic angle sensor detector 10b, offset adjustments can be made easily by setting to −1 volt. Thus, this has no effect on the mounting of angle sensor 10.

Following bonding in the manner described above, bonding arm 3 is rotated about shaft 5 in the clockwise direction as indicated in FIG. 2(A) by a previously set amount of movement by exciting coil 6a of linear motor 6, after which it is stopped at that position. Bonding is then performed by moving bonding head 1 to the lead side, which is the set bonding point, according to the same process as described above, by moving the XY table.

The above-mentioned process is repeated until all pads of semiconductor pellet and leads of the lead frame are connected to complete bonding.

As has been described above, as an analog signal is obtained which is proportional to the angle of a bonding arm through the use of an angle sensor, the present invention offers the advantage of being able to easily determine the amount of movement and absolute position of a bonding tool. Further, in addition to being able to improve resolution by converting the analog signal obtained from said angle sensor to a digital signal, the composition of the device is such that the angle sensor performs detection without making contact, thus offering a further advantage in that mounting of the sensor is easy and assembly adjustments can be performed simply. Moreover, the present invention offers an additional advantage in that a separate detecting sensor for detecting the reference position of the bonding arm is not required.

What is claimed is:

1. A wire bonder, comprising:
a head base provided on a member capable of planar movement in at least the X and Y directions; a shaft supported by said head base; a bonding arm provided so as to be allowed to freely oscillate about said shaft while supporting a bonding tool through which a wire is passed; and an angle sensor provided on said wire bonder which detects, without making contact with any moving element, the angle of rotation of said bonding arm as it pivots about said shaft.

2. A wire bonder as described in claim 1, in which said angle sensor is comprised of a non-contact magnetic angle sensor.

3. A wire bonder as described in claim 1, in which the output of said angle sensor is obtained in the form of an analog signal proportional to the angle of rotation.

4. A wire bonder as described in claim 2, in which the output of said angle sensor is obtained in the form of an analog signal proportional to the angle of rotation.

5. A wire bonder, comprising:
a head base provided on a member capable of planar movement in at least the X and Y directions;
a shaft supported by said head base;
a bonding arm provided so as to be allowed to freely oscillate about said shaft while supporting a bonding tool through which a wire is passed, said shaft supporting said bonding arm; and
an angle sensor provided on said wire bonder which detects, without making contact with any moving element, the angle of rotation of said bonding arm as it pivots about said shaft, said angle sensor comprising a magnetic angle sensor magnetic body mounted on said shaft and a magnetic angle sensor detector mounted fixedly on said head base.

6. A wire bonder as described in claim 5, wherein said magnetic angle sensor magnetic body has a cylindrical shape with a cross-section having a U-shape.

7. A wire bonder as described in claim 6, wherein said magnetic angle sensor detector includes a sensor rod inserted without making contact into said magnetic angle sensor magnetic body.

8. A wire bonder, comprising:
a head base provided on a member capable of planar movement in at least the X and Y directions;
a shaft supported by said head base;
a bonding arm provides so as to be allowed to freely oscillate about said shaft while supporting a bonding tool through which a wire is passed, said shaft supporting said bonding arm; and
an angle sensor provided on said wire bonder which detects, without making contact with any moving element, the angle of rotation of said bonding arm as it pivots about said shaft, said angle sensor comprising a magnetic angle sensor magnetic body mounted on said shaft and a magnetic angle sensor detector mounted fixedly on said head base,
wherein the angle of rotation of said bonding arm is determined based upon an output of said angle sensor.

9. A wire bonder as described in claim 8, wherein a center axis of said bonding arm is capable of being offset and is adapted for use as a reference position of said angle sensor, said wire bonder further comprising means for determining an absolute height of the bonding arm from a bonding stage.

10. A wire bonder according to claim 8, wherein an output of said angle sensor corresponds to said angle of rotation of said bonding arm.

* * * * *